(12) United States Patent
Chan

(10) Patent No.: US 6,629,363 B1
(45) Date of Patent: *Oct. 7, 2003

(54) PROCESS FOR MECHANICALLY ATTACHING A TEMPORARY LID TO A MICROELECTRONIC PACKAGE

(75) Inventor: Joseph Ying-Yuen Chan, Fishkill, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/010,614

(22) Filed: Jan. 22, 1998

(51) Int. Cl.[7] .............................................. H01R 43/00
(52) U.S. Cl. ............................. 29/832; 29/740; 29/742; 29/743; 29/840; 174/258; 174/260; 361/728; 361/820; 156/306.6; 156/247
(58) Field of Search ........................ 29/740, 742, 743, 29/744, 840, 832; 439/135, 149; 361/728, 820; 174/260, 258; 156/247, 306.6

(56) References Cited

U.S. PATENT DOCUMENTS

| | | | | |
|---|---|---|---|---|
| 4,097,101 A | * | 6/1978 | Holt et al. ................. | 339/17 C |
| 4,382,327 A | * | 5/1983 | Bardens et al. ............... | 29/588 |
| 4,714,905 A | * | 12/1987 | Bernstein et al. ............ | 333/167 |
| 5,093,282 A | * | 3/1992 | Ohno et al. .................. | 437/221 |
| 5,379,188 A | * | 1/1995 | Winslow ..................... | 361/760 |
| 5,420,488 A | * | 5/1995 | Gutman ................... | 318/568.12 |
| 5,422,554 A | * | 6/1995 | Rohde .................... | 318/568.21 |
| 5,473,512 A | * | 12/1995 | Degani et al. .............. | 361/760 |
| 5,507,657 A | * | 4/1996 | Seto et al. ................... | 439/135 |
| 5,579,212 A | * | 11/1996 | Albano et al. .............. | 361/820 |
| 5,613,864 A | * | 3/1997 | Northey ..................... | 439/149 |
| 5,628,110 A | * | 5/1997 | Sakaguchi et al. ............ | 29/840 |
| 5,688,133 A | * | 11/1997 | Ikesugi et al. .............. | 439/135 |
| 5,832,598 A | * | 11/1998 | Greenman et al. ............ | 29/840 |
| 5,878,484 A | * | 3/1999 | Araya et al. .................. | 29/740 |
| 5,899,760 A | * | 5/1999 | Ho et al. ..................... | 439/135 |
| 5,978,229 A | * | 11/1999 | Kim ............................ | 361/760 |

* cited by examiner

Primary Examiner—Carl J. Arbes
Assistant Examiner—Minh Trinh
(74) Attorney, Agent, or Firm—RatnerPrestia; Tiffany L. Townsend, Esq.

(57) ABSTRACT

A process for picking up and moving a microelectronic package during card assembly operations. A clipping lid having a top surface and at least two sides attaches to a substrate via friction where the sides act as leaf springs gripping the substrate. The top surface of the lid provides a clean, smooth, flat surface to which a vacuum probe may be attached. In the preferred embodiment, the lid and sides are formed from an integral piece of stainless steel. Also provided are flares at the bottom of each side to aid in guiding the lid onto the substrate. Protrusions are provided in the sides to prevent the lid from slipping too far onto the substrate and contacting the components mounted to the substrate. Also provided is at least one hole in the top surface to allow the lid to be pried free from the substrate after completion of the steps where vacuum probe movement is required.

2 Claims, 3 Drawing Sheets

PROCESS FOR MECHANICALLY ATTACHING A TEMPORARY LID TO A MICROELECTRONIC PACKAGE

FIELD OF THE INVENTION

The present invention relates generally to electronic device packaging. More particularly, this invention includes a process and apparatus for securing a temporary lid to a chip substrate to aid in movement of the chip substrate during automated card assembly operations.

BACKGROUND OF THE INVENTION

The increasing use of ceramic, multiple-chip modules incorporating flip-chip devices has caused correspondingly larger demands on card assembly machines which perform high-speed "pick-and-place" operations. The ever-increasing range of possible chip layouts and encapsulation schemes exacerbates those demands. Therefore, the card assembly machines have had to become, and continue to become, better suited to perform pick-and-place operations on chip modules during card assembly.

Typically, in the case of common, plastic, overmolded, dual-in-line packages (DIPs), automated picking of the components is performed by a vacuum probe. The vacuum probe attaches to the card package by contacting the flat, plastic, outer surface of the chip. The difference in pressure between the ambient atmosphere and the inside of the vacuum probe (with the chip surface sealing the probe opening) keeps the package attached to the probe until the vacuum is released, which releases the package from the tip of the vacuum probe. FIG. 1 illustrates this process according to the prior art, where vacuum probe 110 is shown attached to the module 100 through contact with chip 120. The module 100 is typically referred to as a capless chip module. The module 100 of FIG. 1 is shown as already placed and seated on a printed circuit board 130.

FIG. 1 also shows additional components of a typical capless chip module 100 seated on top of a printed circuit board 130, according to the prior art. Printed circuit board 130 supports a plurality of solder balls 140 which in turn support a substrate 150 (often, but not necessarily, ceramic). If the substrate is ceramic, the substrate 150 and its solder balls form what is known as a ceramic ball grid array (CBGA). Alternatively, a ceramic column grid array (CCGA) (not shown) technology could be used. Typically, the chip 120 is secured to the substrate 150 via a plurality of controlled collapse chip connection (C4) balls 145.

The substrate 150 could also have one or more electronic devices 160 attached to it via the C4 balls 145. Examples of such electronic devices include: decoupling capacitors, resistors, capacitors, and inverters. In addition, these devices could be attached to the substrate not by C4 balls 145, but rather by surface-mountable solder (not shown). For reliability reasons, the C4 balls are encapsulated with a polymeric underfill material 170. Where multiple chips and electronic devices are combined oh one substrate, as in FIG. 2, the package is typically referred to as a multiple chip module (MCM).

In a typical card assembly manufacturing process, a pick-and-place tool picks up each module 100 that is to be joined to the printed circuit board and places it in the proper location. The board 130 and these placed modules 100 are then heated in a card assembly heating apparatus and the solder balls 140 are "reflowed" causing the connection of module 100 and printed circuit board 130 to occur.

As MCMs become larger and more specialized, automated pick-up and placement of cap-less modules become more difficult because the chip center lines may be located on an asymmetric grid with respect to the center line of the module. In other words, with a multitude of chips and components on the substrates (as is the trend), there may not be a clean, flat, and smooth surface available in the middle of the module to which the vacuum probe can attach. Non-flat surfaces having encapsulants, glob top, or other polymeric materials also create problems for pick-up tools. Unless the card assembly picking tooling is automated and flexible enough to locate a chip surface off the packaging center (even in a high-speed mode), tool efficiency will suffer greatly, because many chips will simply not be picked up without changes being made in the tooling each time a module type is run. Moreover, many automated pick-and-place tools cannot move off module centers and such tools cannot practically be modified (due, in part, to cost constraints). The vacuum probe method is most economical and efficient for packages having a relatively flat top surface. It is often not well suited, however, to making dynamic, offset motions needed to accommodate off-center device locations, nor is it effective in spanning multiple chips, unless a custom pickup probe is fitted to each package type.

FIG. 3 illustrates another process for moving chip modules 100 during production according to the prior art, where the center of the lid is used for pick and place operations. The module shown in FIG. 3 is typically referred to as a capped module, because a module cap 210 is used. Here, vacuum probe 110 is attached not to a chip, but rather to module cap 210. Module cap 210 is attached to substrate 150 of module 100 via a cap seal 220 (adhesive for non-hermetic modules and solder or glass for hermetic modules). Module cap 210 is attached to chips 120 via a semi-liquid or paste-type, thermally conductive material 230. It is important that cap 210 be attached to each chip 120 through a thermally conductive material because the chips would otherwise overheat during operation. Module cap 210 is typically metal and presents a clean, smooth, flat surface to vacuum probe 110.

In the package assembly shown in FIG. 3, because the cap 210 is attached to the substrate 150 via a cap seal 220, the attachment is substantially permanent. If the cap 210 is removed from the substrate 150 at some later step for rework in the manufacturing process, the substrate may be damaged, or seal material may be left behind. Such a condition increases the risk of damage when additional components are subsequently reworked to the substrate 150. The trend is away from module caps 210 and toward non-hermetic packaging methods.

In the device as illustrated in FIG. 3, the chips 120 are attached to the module cap 210 via thermally conductive material 230 which transfers heat from the chips 120 to the module cap 210 where it can be further dissipated. The necessity of a thermally conductive material 230 associated with capped modules adds to the cost of reworking and adds a higher rate of unreliability to the package.

The deficiencies of the conventional manufacturing techniques show that a need still exists for a process and apparatus which will accurately and reliably attach a temporary, removable lid to a chip carrier to allow vacuum pick-up by high-speed, automated assembly tools. Therefore, one object of the present invention is to provide an apparatus and process for attaching a temporary, removable lid to a chip carrier containing one or more microelectronic devices using a mechanical clipping lid which attaches to the substrate via friction that allows efficient vacuum pick-up by high-speed, automated assembly tools.

Another object of the present invention is to provide an easily removable lid attachment which may be removed after the need for vacuum probe attachment is no longer necessary in the manufacturing process. This object would include a removable lid which does not, upon removal, result in mechanical or structural damage to the devices that would impede subsequent heatsink attachment schemes which may involve the use of adhesive compounds.

Still another object of the present invention is to provide a process and apparatus that will absorb thermally induced strain without damage to the chip carrier or associated devices. Still yet another object of the present invention is to provide an apparatus that will allow pressure to be applied to the module during testing and burn-in without damage to the module.

Yet another object of the present invention is to provide a process and apparatus for ensuring mechanical and operational integrity of the bond between devices on the substrate and a heatslug, especially under typical shipping and use conditions such as gravity, mechanical shock, vibration, high temperature, humidity, and repeated thermal expansion and contraction cycles due to temperature cycling during operation.

SUMMARY OF THE INVENTION

To achieve these and other objects, and in view of its purposes, the present invention provides a process and apparatus for high speed pick-up and placement of a chip module during card assembly. A mechanical clip is temporarily attached to the chip substrate and covers the components attached to the substrate. The top surface of the mechanical clip is a flat, clean, and smooth metal surface, providing a smooth and clean contact area for a vacuum probe to pick up the module. During manufacturing steps which require the movement of the module, the clip is maintained in place. After reflow is complete and the module is attached to a printed circuit board, the clip may be removed, either to be discarded or reused.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
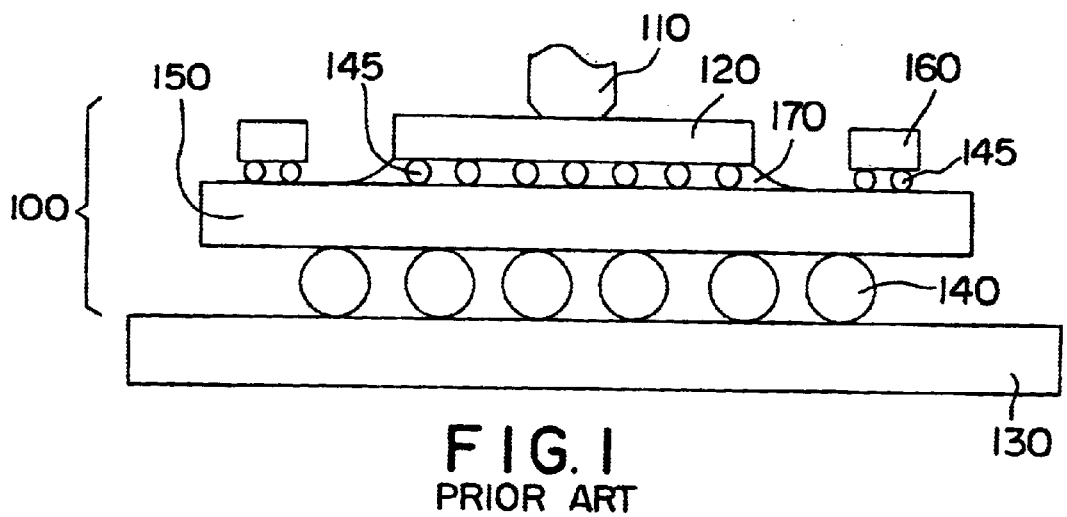
FIG. 1 illustrates an apparatus picking up a capless chip module according to the prior art.
Figure 2:
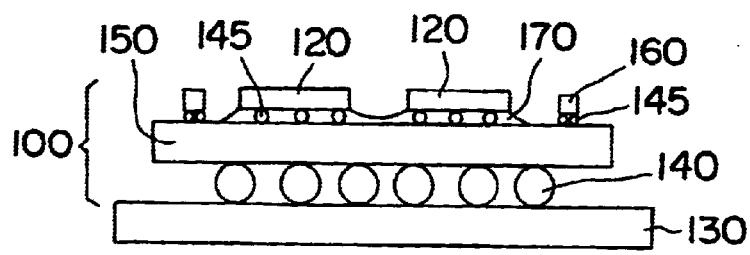
FIG. 2 illustrates a capless, multiple chip module.
Figure 3:
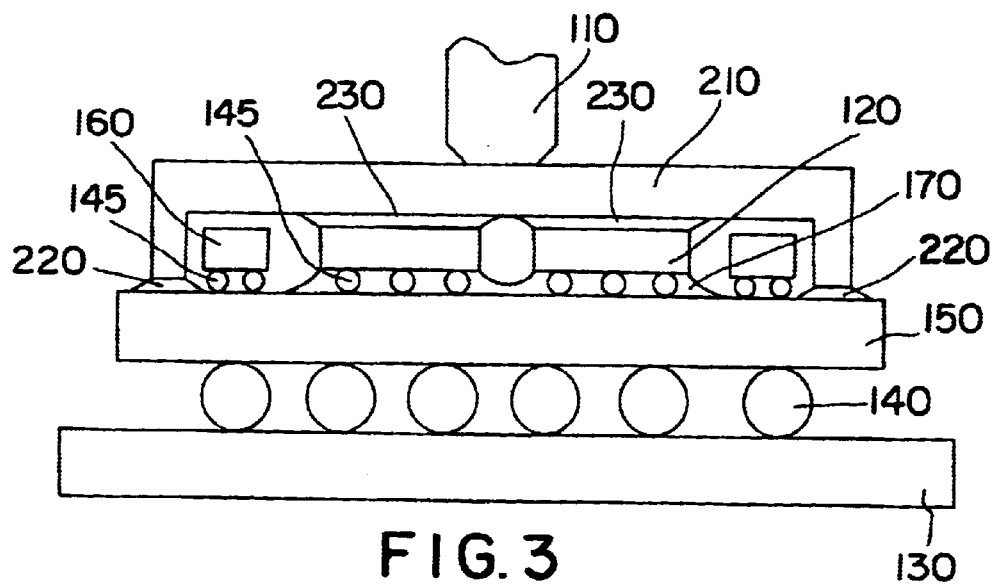
FIG. 3 illustrates an apparatus picking up a capped, multiple chip module according to the prior art.

The present invention provides a process and apparatus for high speed pick-up and placement of a chip module during card assembly. Each labeled element of the drawing maintains its reference number in all figures throughout the drawing. A mechanical clip 300 is temporarily attached to the chip substrate 150 and covers the components attached to the substrate 150. The top surface of the mechanical clip 300 is a flat metal surface, providing a smooth and clean contact area for a vacuum probe 110 to pick up the module 100. Substrate 150 may be plastic, ceramic, or of other suitable materials.

Figure 4A:
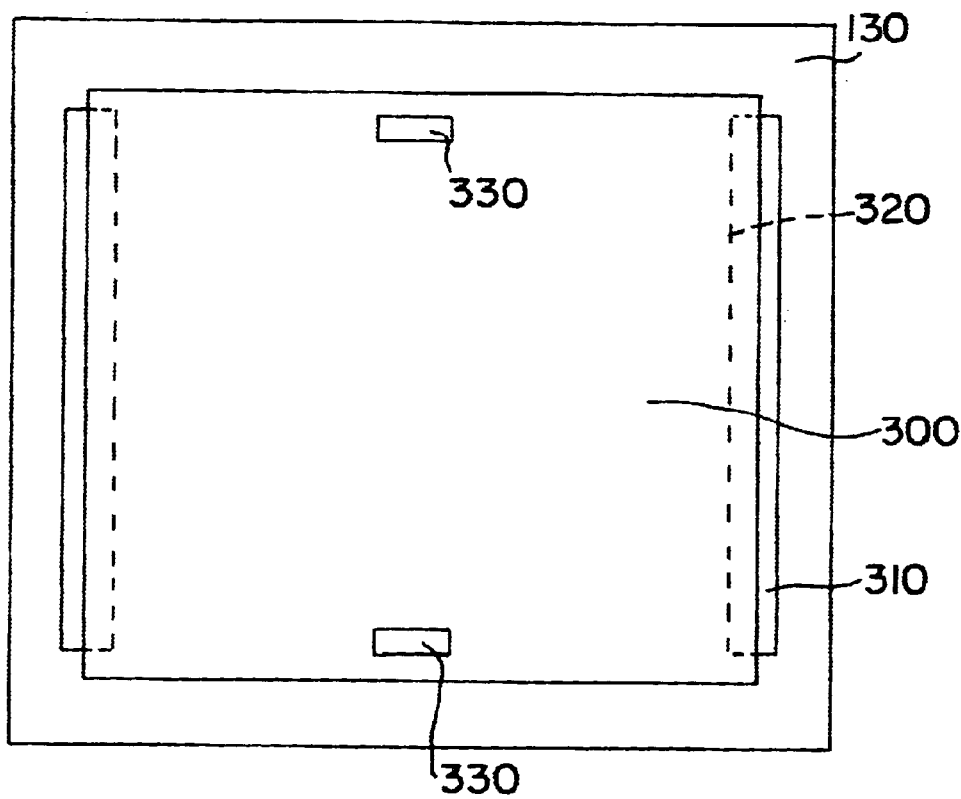
FIG. 4A illustrates a top view of a capped, multiple chip module according to the present invention.
Figure 4B:
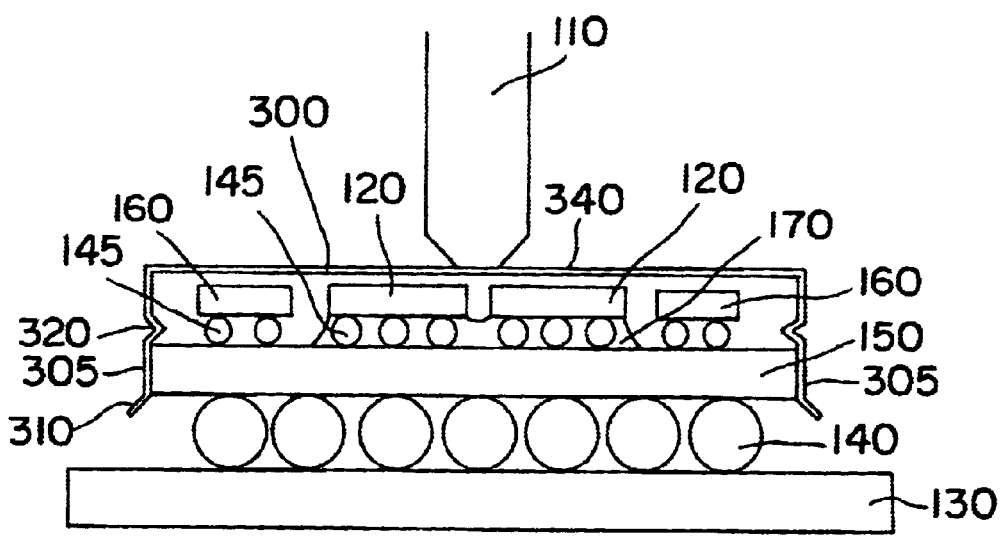
FIG. 4B illustrates a side view of an apparatus picking up a capped, multiple chip module according to the present invention.

FIGS. 4A and 4B illustrate two views of the mechanical clip 300 according to the present invention. In the preferred embodiment clip 300 is formed from one integral piece of metal. FIG. 4A shows the top view of the clip 300. FIG. 4B shows the side view of the mechanical clip 300 in position with vacuum probe 110 sealed to the top surface 340 of the clip 300, ready to pick up the module. The top surface 340 of clip 300 provides a clean, flat surface of adequate size to assure that vacuum probe 110 can pull a vacuum and lift module 100.

The clip 300 attaches to the substrate 150 via a friction fit against the sides of substrate 150. More particularly, the vertical sides 305 of clip 300 act as leaf springs creating a spring load pressing against the substrate 150 with enough force to allow the entire microelectronic package to be picked up and moved. The clip 300 may be made of any suitable material, but the preferred embodiment is metal, especially stainless steel. A stainless steel clip 300 can sustain solder reflow cycle parameters (e.g., over 185° C. for 2–4 minutes) and is rust resistant.

The first step of the pick-up process is to lower the clip 300 onto the top of the module. A flair, or guide 310, is provided to aid in seating the clip 300 onto the substrate 150 as the clip 300 is lowered into position. Thus, precise positioning of clip 300 on module 100 is not required. The guide 310 extends outward from the plane of the side 305 at an angle less than 90%.

A notch or indent 320 is provided in the clip 300 to provide a positive stop such that the clip 300 will not be lowered too far onto the module and contact the module components such as chips 120 and other electronic devices 160. The indent 320 extends inward from the plane of the side 305, as shown in FIGS. 4A and 4B. Although the inlet configuration described above allows easy manufacturing of the clip 300, any such protrusion extending in from the side 305 will serve the stopping function. Once clip 300 is attached to the module substrate 150, vacuum probe 110 can attach to the clip 300 and the module can be moved as necessary.

After the necessary movement has been completed and it is desired to remove the clip 300 from the module, holes 330 are used to disengage the clip 300. An operator may simply insert a tool, such as a small screwdriver, into the holes and pry the clip 300 off the substrate 150. FIG. 4A shows two holes 330 on the sides perpendicular to the clip guides 310 and indents 320, but the holes 330 may also be placed on the same edges as the guides 310 and indents 320, or on all four edges of the clip 300. Alternatively, only one hole 330 may be provided in the clip 300. Once the clip 300 is removed, the top surfaces of the components are exposed in preparation for direct heatsink attachment, or any other necessary step in the assembly operation.

Figure 5:
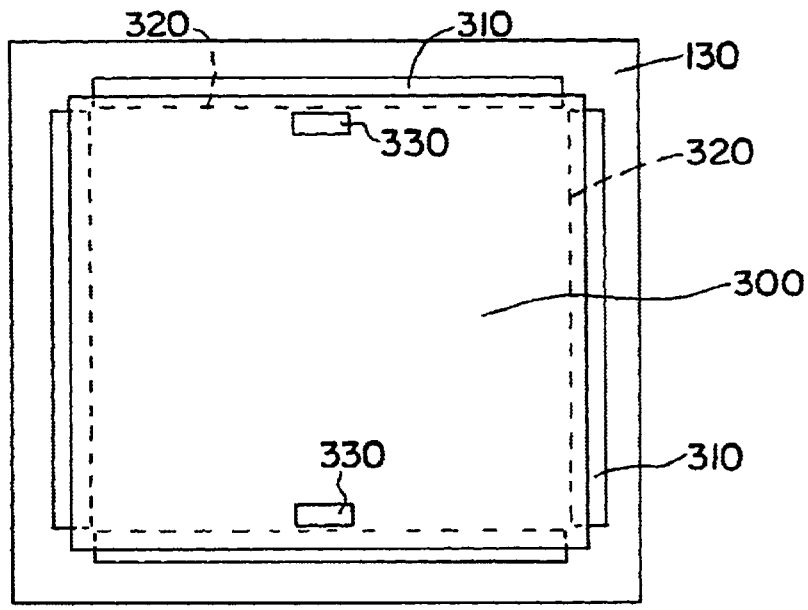
FIG. 5 illustrates an alternative embodiment of the present invention.

FIG. 5 shows an alternative embodiment where the clip 300 has clip guides 310 and indents 320 on all four sides of the clip. As above, holes 330 may be placed on any one side, on any two sides opposite each other, or on all four sides of clip 300. A configuration such as the one illustrated in FIG. 5 would provide increased strength for picking the module. The clip 300 of the present invention provides a load-bearing surface, for example during module test and burn-in which can carry about 65 lbs. (specifications require about 30 lbs.) without deflection or damage.

An additional advantage to the present invention is that the clip 300 allows pressure to be applied to the chip module 100 without damaging the chips 120 or electronic devices 160. Pressure is applied during the reflow process and then later to test the bonding between the solder balls 140, substrate 150, and printed circuit board 130. Tests conducted by the inventors showed that up to about 65 lbs. of force could be applied to the clip 300 without resulting in damage to the module.

Clip 300 can be applied to CBGA, CCGA, wire bond, tab or other joining techniques; clip 300 could be used on any microelectronic package. In addition to permitting pick-and-place tools to work on a variety of modules 100, clip 300 can provide temporary protection during shipping and handling of the microelectronic packaging.

Figure 6A:
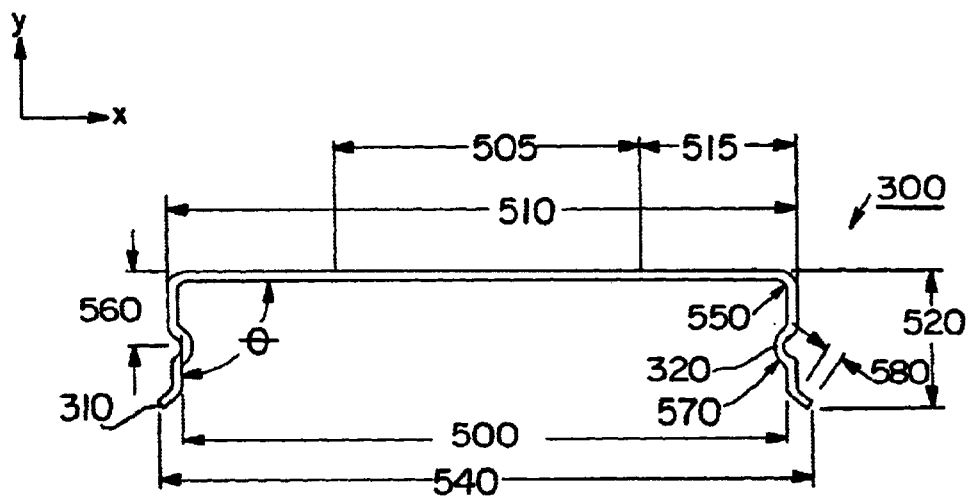
FIG. 6A illustrates a side view of a clip according to the present invention.
Figure 6B:
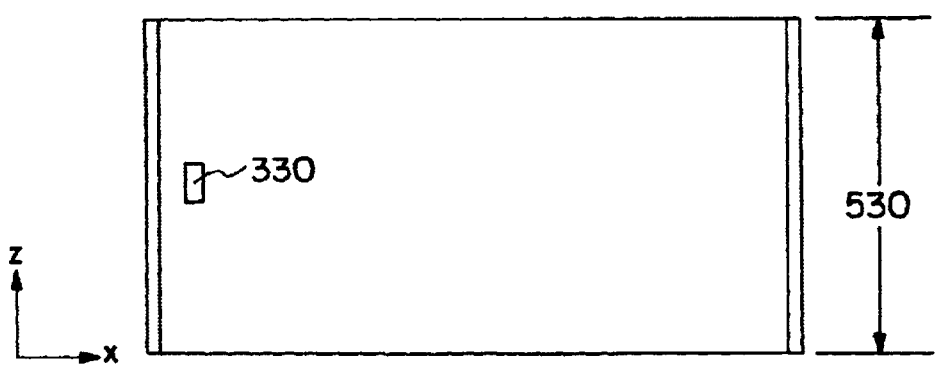
FIG. 6B illustrates a top view of a clip according to the present invention.

FIGS. 6A and 6B show a specific embodiment of the present invention. Dimensions of clip 300 are provided here for a ceramic substrate having a length in the x-direction of about 1.00". In no way is this particular embodiment intended to limit the application of this invention. Rather, dimensions are shown in this embodiment to demonstrate the relationship between different parts of the invention based on an exemplary substrate size.

FIGS. 6A and 6B show a side and top view, respectively, of a clip 300 according to the present invention. FIG. 6B illustrates that for a clip 300 to hold a ceramic substrate having a length in the x-direction of 1.00", the clip 300 would have a length 500 in the x-direction between 0.97" and 1.00". The overall span 540, in the x-direction, of clip 300 designed to pick a ceramic substrate 1.00" in length, would be 1.06", including both guides 310. Consistent with this dimension and a typical stainless steel sheet, outside dimension 510 is 1.019". For a this clip 300, based on typical dimensions of substrate components, height 520 would be 0.222". Completing the overall dimensions, clip 300 would have a width 530 in the z-direction of 0.625".

In this exemplary embodiment, vertical sides 305 would extend down from the top surface 340 at an angle $\Theta$ of about 87°. This same angle $\Theta$ has a radius 550 of 0.015". The distance 560 from the middle of indent 320 to the top plane of surface 340 is 0.12". The radius 570 of indent 320 is 0.03". The length 580 of guide 310 is 0.022". For a ceramic substrate of 1.00", there is an allowable bow in section 505 of 0.008" in the y-direction. Section 505 is 0.5" in length and is offset from either end of the clip in the x-direction by offset distance 515 which is itself about 0.25" in length.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention. Clip 300 is one embodiment, for example, of the temporary lid attachment of the present invention.

What is claimed:

1. A process for manufacturing a microelectronic package which has at least two sides, each side having a length, comprising:

frictionally attaching, along the length of at least two sides of the package, without the use of an adhesive, a removable and temporary clip to the microelectronic package, the clip having a top surface and at least two sides;

engaging the clip with a pick-and-place tool;

moving the package through a series of manufacturing steps; and removing the clip wherein the clip is removed by inserting a tool into at least one hole located on the top surface of the clip and prying the clip free from the microelectronic package.

2. The process of claim 1 wherein the series of manufacturing steps includes placing the module of the microelectronic package onto a printed circuit board.

* * * * *